(12) United States Patent
Moore et al.

(10) Patent No.: US 7,644,051 B1
(45) Date of Patent: Jan. 5, 2010

(54) MANAGEMENT OF DATA CENTERS USING A MODEL

(75) Inventors: Justin Moore, Durham, NC (US); Parthasarathy Ranganathan, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 557 days.

(21) Appl. No.: 11/494,918

(22) Filed: Jul. 28, 2006

(51) Int. Cl.
*G06F 15/18* (2006.01)
*G06E 1/00* (2006.01)
*G06E 3/00* (2006.01)
*G06G 7/00* (2006.01)
*G06N 5/00* (2006.01)

(52) U.S. Cl. .............................. 706/21; 706/16; 706/45; 706/903

(58) Field of Classification Search .................. 706/21, 706/16, 44, 903, 45
See application file for complete search history.

(56) References Cited

U.S. PATENT DOCUMENTS

| 5,111,531 | A * | 5/1992 | Grayson et al. ................ 706/21 |
| 5,913,194 | A * | 6/1999 | Karaali et al. ................ 704/259 |
| 6,601,051 | B1 * | 7/2003 | Lo et al. ....................... 706/23 |
| 2003/0182249 | A1 * | 9/2003 | Buczak ......................... 706/15 |
| 2006/0155486 | A1 * | 7/2006 | Walsh et al. ................... 702/32 |

OTHER PUBLICATIONS

Moore,J. et al. "Making Scheduling "Cool": Temperature-Aware Workload Placement in Data Centers" 2005 USENIX Annual Technical Conference. Apr. 2005.*
Haykin,S. "Neural Networks: A Comprehensive Foundation, Second Edition" Sections 1.1, 1.8, 2.10, 4.14. Prentice Hall. 1999. pp. 1-6,34-37,66-75,213-218.*
Moore,J. et at. "Data center workload monitoring, analysis, and emulation" in Eighth Workshop on Computer Architecture Evaluation using Commercial Workloads, Feb. 2005.*
Moore,J. et al. "Going beyond CPUs: The Potential of Temperature-Aware Solutions for the Data Center" 2004.*
Patel,C.D. et al. "Thermal considerations in cooling large scale high compute density data centers" in Proceedings of the Eight Inter-Society Conference on Thermal and Thermomechanical Phenomena in Electronic Systems (ITherm), San Diego, CA, Jun. 2002.*
APC InfraStruXure, http://www.apcc.com/products/infrastruxure/index.cfm, downladed Jun. 15, 2006.
Fast Articificial Neural Network Library, http://leenissen.dk/fann/, downloaded Jun. 15, 2006.
Anderson, D. et al., "More than an Interface—SCSI vs. ATA", Proc. of the 2nd Annual Conf. on File and Storage Technology, Mar. 2003.

(Continued)

*Primary Examiner*—David R Vincent
*Assistant Examiner*—Benjamin Buss

(57) ABSTRACT

In a method for managing a data center, data for a training set of data is collected. The data includes heat loads generated by a plurality of electronic components and temperatures at multiple locations in the data center and under varying power profiles. A machine learning application is implemented to develop a model of a thermal topology of the data center using the training set of data and the model is implemented to predict heat profiles corresponding to a plurality of power profiles that are outside of the training set of data.

17 Claims, 5 Drawing Sheets

OTHER PUBLICATIONS

Arlitt, M. et al., "Workload Characterization of the 1998 World Cup Web Site", HPL-1999-35, Hewlett Packard, Sep. 1999.

Beitelmal, M. H. et al., "Thermo-Fluids Provisioning of a High Performance High Density Data Center", HPL-2004-146, Hewlett Packard, Sep. 24, 2004.

Bianchini, R. et al., "Power and Energy Managment for Server Systems", Technical Report DCS-TR-528, Jun. 2003.

Bradley, D.J. et al., "Workload-based Power Management for Parallel Computer Systems", IBM Res. & Dev. vol. 47, No. 5/6, Sep./Nov. 2003.

Chase, J.S. et al., "Managing Energy and Server Resources in Hosting Centers", downloaded Jun. 15, 2006, ACM. 2001.

Chen, Y. et al., "Managing Server Energy and Operational Costs in Hosting Centers", Proc. of the 2005 ACM Sigmetrics, p. 303-314, 2005, Abstract only.

Elnozahy, M. et al., "Energy Conservation Policies for Web Servers", downloaded Jun. 15, 2006, Published: 2003.

Felter, W. et al, "A Performance-Conserving Approach for Reducing Peak Power Consumption in Server Systems", International Conf on Supercomputing, p. 293-302, 2005, Abstract.

Flautner, K. et al., "Vertigo: Automatic Performance-Setting for Linux", downloaded Jun. 16, 2006, ACM. 2002.

Jung, J. et al., "Flash Crowds and Denial of Service Attacks: Characterization and Implication for CDNs and Web Sites", ACM May 2002.

Lippmann, R. P., "An Introduction to Computing with Neural Nets", IEEE ASSP Magazine, Apr. 1987.

Moore, J. et al., "Making Scheduling "Cool": Temperature-Aware Workload Placement in Data Centers", 2005 USENIX Annual Technical Conference.

Pinheiro, E. et al., "Load Balancing and Unbalancing for Power and Performance in Cluster-Based Systems", Technical Report DCS-TR-440, May 2001.

Rajamani, K. et al., "On Evaluating Request-Distribution Schemes for Saving Energy in Server Clusters", downloade Jun. 16, 2006, IEEE. Mar. 2003.

Ranganathan, P. et al., "Enterprise IT Trends and Implications for Architecture Research", downloaded Jun. 16, 2006, Feb. 2005.

Sharma, R. K. et al., "Balance of Power: Dynamic Thermal Management for Internet Data Centers", HPL-2003-5, Hewlett Packard Co., Feb. 18, 2003.

Sharma, V. et al., "Power-aware QoS Management in Web Servers", downloaded Jun. 16, 2006, IEEE. 2003.

Sullivan, R. F., "Alternating Cold and Hot Aisles Provides More Reliable Cooling for Server Farms", The Uptime Institute, 2002-2006.

Weissel, A. et al., "Dynamic Thermal Management for Distributed Systems", downloaded Jun. 16, 2006, TACS'04. 2004.

Zeng, H. et al., "ECOSystem: Managing Energy as a First Class Operating System Resource", Technical Report CS-2001-01, Mar. 2001, revised Aug. 2001.

\* cited by examiner

MANAGEMENT OF DATA CENTERS USING A MODEL

BACKGROUND

A data center may be defined as a location, for instance, a room that houses computer systems arranged in a number of racks. These racks are configured to house a number of computer systems which typically include a number of printed circuit boards (PCBs), mass storage devices, power supplies, processors, micro-controllers, and semi-conductor devices, that dissipate relatively significant amounts of heat during their operation.

It is often beneficial to track the temperatures of cooling airflow supplied into the computer systems to generally ensure that the computer systems remain below specified temperatures. Conventionally, the airflow temperatures have been detected through use of relatively large numbers of temperature sensors positioned throughout the data center. One problem associated with this approach is that the costs in obtaining and installing the temperature sensors are typically prohibitively high. Another approach to tracking the airflow temperatures is to calculate the airflow temperatures through use of computational fluid dynamics (CFD) programs. This approach, however, often requires the CFD programs to run for many hours due to the complexities involved in calculating the airflow temperatures and is thus unsuitable for many applications.

The problems associated with conventional airflow temperature tracking approaches are further exacerbated with the recent trends toward consolidation and increased computer system densities in the data centers. That is, recent trends in data center design require either greater numbers of temperature sensors or greater computational abilities to track the airflow temperatures in data centers.

BRIEF DESCRIPTION OF THE DRAWINGS

Features of the present invention will become apparent to those skilled in the art from the following description with reference to the figures, in which.

DETAILED DESCRIPTION OF THE INVENTION

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

Disclosed herein are systems and methods for predicting the heat profile, that is, the temperature of airflow at individual locations, for a given data center configuration. As discussed herein below, the heat profile of the data center may be determined through a model which predicts the thermal topology of the data center at various power and cooling profiles. Also discussed herein below are various manners in which the model may be developed using machine learning applications.

The model may be implemented to predict heat profiles resulting from various workload placement configurations. This information may be used to predict whether certain workload placement configurations will yield inefficient cooling arrangements or cooling arrangements that may lead to hot spots in the data center. This information may also be used to predict how the workload placement configurations will affect cooling costs. In addition, the model enables a quantitative comparison between proposed workload placement configurations to be determined. As such, a list of the electronic components configured to perform the workloads may be created according to the comparative cooling costs associated with running workloads on the electronic components. In one regard, therefore, workloads may selectively be run on the electronic components according to their associated cooling costs.

Through implementation of the methods and systems disclosed herein, a relatively accurate approximation of the thermal conditions in a data center may be obtained. More particularly, the model discussed herein below generally enables the heat profile of the data center to be predicted in a relatively quick and efficient manner. As such, the model for predicting the heat profile overcomes many of the difficulties and drawbacks associated with conventional methods and systems for determining the data center heat profile.

Figure 1:
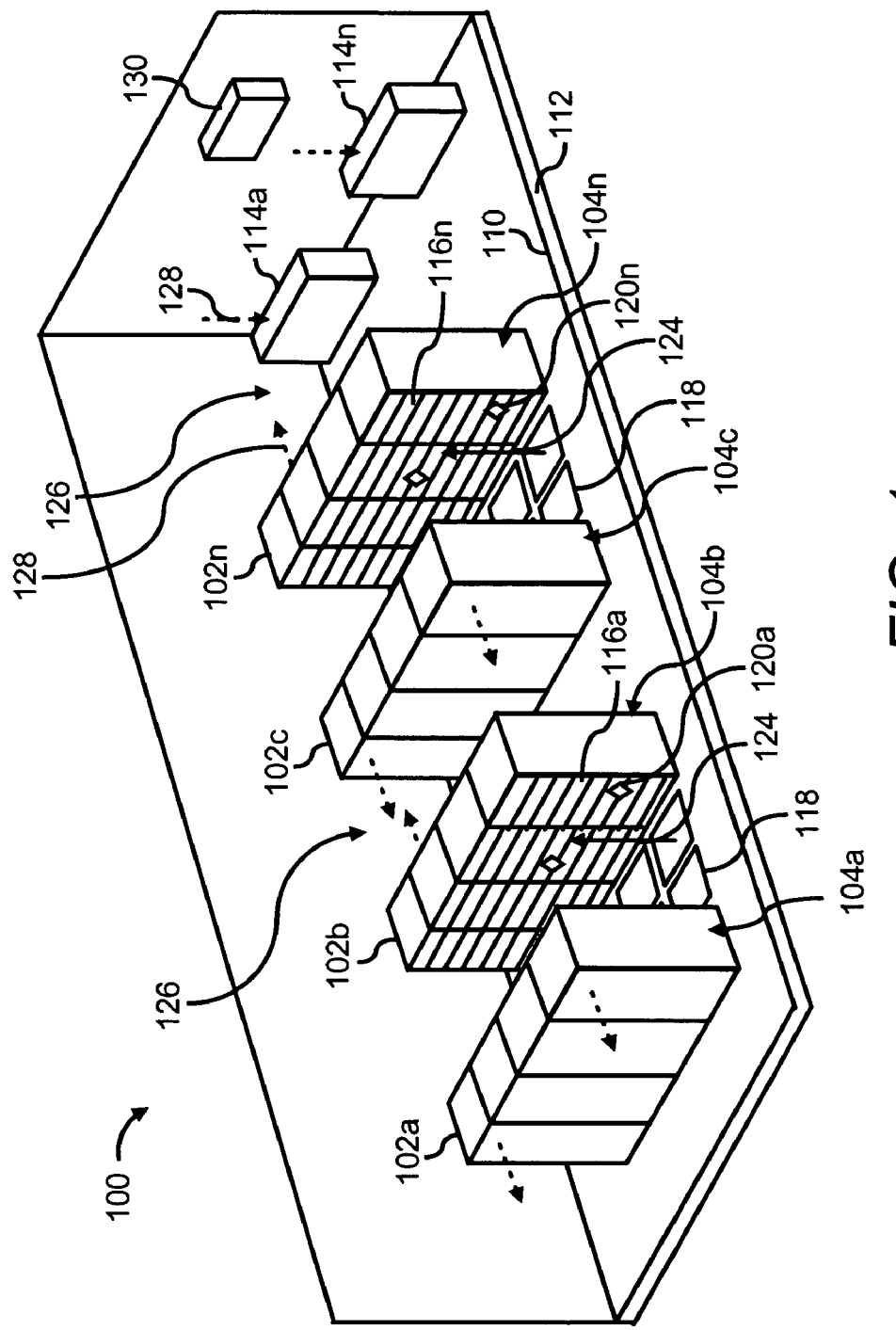
FIG. 1 shows a perspective view of a section of a data center which may employ various examples of a system for management of various operations of the data center disclosed herein, according to an embodiment of the invention.

With reference first to FIG. 1, there is shown a simplified perspective view of a section of a data center 100 which may employ various examples of a system for management of various operations in the data center 100 disclosed herein. The terms "data center" are generally meant to denote a room or other space where one or more components capable of generating heat may be situated. In this respect, the terms "data center" are not meant to limit embodiments of the invention to any specific type of room where data is communicated or processed, nor should it be construed that use of the terms "data center" limits the invention in any respect other than its definition herein above.

The data center 100 is depicted as having a plurality of racks 102a-102n, where "n" is an integer. The racks 102a-102n may comprise, for instance, electronics cabinets configured to house electronic components 116a-116n, for instance, computers, servers, bladed servers, disk drives, displays, etc. The subsystems and the components may be operated to perform various electronic functions, for instance, computing, switching, routing, displaying, and the like.

The racks 102a-102n are depicted as being positioned on a raised floor 110, which may function as a plenum for delivery of cooled air from one or more air moving devices 114a-114n. The air moving devices 114a-114n, where "n" is an integer, generally operate to supply airflow into a space 112 beneath a raised floor 110, and in certain instances to cool heated air (indicated by the arrows 128). In addition, the air moving devices 114a-114n may supply the electronic components 116a-116n housed in the racks 102a-102n with airflow that has been cooled, through any reasonably suitable known manners and may thus comprise widely available, conventional air conditioning (AC) units. For instance, the air moving devices 114a-114n may comprise vapor-compression type air conditioning units, chiller type air conditioning units, etc. Examples of suitable air moving devices 114a-114n may be found in co-pending and commonly assigned U.S. patent application Ser. No. 10/853,529, filed on May 26, 2004, and entitled "Energy Efficient CRAC Unit Operation," the disclosure of which is hereby incorporated by reference in its entirety.

The air moving devices 114a-114n include respective actuators (not shown) configured to manipulate characteristics of the cooled airflow supplied to the racks 102a-102n, such as airflow temperature and supply rate. As such, the actuators include, for instance, devices for manipulating airflow temperature, such as chillers, heat exchangers, etc., and devices for manipulating the supply flow rates, such as variable frequency devices, blowers, etc., of the cooled air. The cooled air, indicated by the arrows 124, may be delivered from the space 112 to the racks 102a-102n through air delivery devices 118 located between some or all of the racks 102a-102n.

The air delivery devices 118 may comprise, for instance, ventilation tiles, variable airflow volume devices, etc., and are shown as being located between rows 104a and 104b and 104c and 104d. Although the air delivery devices 118 and the space 112 have been depicted as being located on a floor of the data center 100, it should be understood that the air delivery devices 118 and the space 112 may be positioned on the ceiling or a wall of the data center 100 without departing from a scope of the invention.

In any regard, the cooled air contained in the space 112 may include cooled air supplied by one or more air moving devices 114a-114n. Thus, characteristics of the cooled air, such as, temperature, pressure, humidity, flow rate, etc., may substantially be affected by the operations of a plurality of the air moving devices 114a-114n. In this regard, characteristics of the cooled air at various areas in the space 112 and the cooled air supplied to the racks 102a-102n may vary, for instance, due to mixing of the cooled air. In other words, the characteristics of the cooled air supplied to a particular location in the data center 100 may differ from that of the cooled air supplied by a single air moving device 114a. In addition, the characteristics of the cooled air supplied through the air delivery devices 118 are affected by the characteristics of air flowing through the other air delivery devices 118.

The characteristics of the airflow, both heated and cooled, in the data center 100 are also affected by the configuration of the racks 102a-102n as well as other components housed in the data center 100. The airflow characteristics are also affected by the amount of heat generated by the electronic components 116a-116n. For instance, the airflow characteristics change as the airflow flows through the racks 102a-102n, as indicated by the arrows 126, and into the air moving devices 114a-114n. More particularly, the types of electronic components 116a-116n housed in the racks 102a-102n as well as the densities with which the electronic components 116a-116n are positioned in the racks 102a-102n, affect the airflow characteristics in the data center 100. The airflow characteristics include, for instance, temperature, airflow direction, airflow velocity, etc.

The heat profile of the data center 100, which may be defined as the temperature at individual locations of the data center 100, may be determined by the thermal topology of the data center 100. The thermal topology of the data center 100 is generally a function of the physical topology of the data center 100, the cooling profile of the data center 100, and the power profile of the data center 100.

According to an example, the heat profile of the data center 100 may be modeled through use of a relatively simple modeling technique. The modeling technique may include, for instance, machine learning approaches, Markov models, linear programming approaches, etc. In any regard, the selected modeling technique may be configured to model the heat profile using dynamic input parameters as well as static components. The dynamic input parameters may comprise parameters that change over the course of standard data center 100 operations, such as, electronic component 116a-116n utilization levels, air moving device 114a-114n supply temperatures and flow rates, air delivery device 118 settings, etc. The static components may include those components that affect airflow, but remain relatively constant, such as, the physical locations of the electronic components 116a-116n, the racks 102a-102n, and the air moving devices 114a-114n, etc. In other words, the static components may comprise elements that affect interactions between the dynamic input parameters, but are not input parameters themselves.

A controller 130 may predict the thermal topology, and thus, the heat profile, of the data center 100. More particularly, the controller 130 may implement one or more of the modeling techniques discussed above to develop a model configured to predict the heat profile of the data center 100 resulting from various workload placement configurations. The controller 130 may use the model to predict how the placement of workloads among one or more electronic components 116a-116n will affect the thermal conditions in the data center 100. In addition, the controller 130 may predict the costs associated with placing the workload on the electronic components 116a-116n in varying configurations to obtain a substantially ordered list of the costs associated with the varying workload placement configurations.

By way of example, the controller 130 may implement the model to predict the temperatures of airflow returned into the air moving devices 114a-114n. The return air temperatures are correlated to the costs associated with cooling the electronic components 116a-116n because the air moving devices 114a-114n vary their operations based upon the return air temperatures. More specifically, the air moving devices 114a-114n typically perform greater amounts of work when the return air temperature is relatively high, which translates into greater costs. In this regard, the controller 130 may implement the model to predict the return air temperatures, and thus the costs associated with these return air temperatures, for various workload placement configurations, and may store that information in a list ordered according to these costs.

The controller 130 may, furthermore, compare the costs with costs associated with other operations in the data center 100 affected by the different workload placement configurations, to select the most cost effective workload placement configuration. In certain examples, the controller 130 may further control one or both of the power distribution, such as through workload placement among the electronic components 116a-116n, and the cooling system components, such as the air moving devices 114a-114n and the air delivery devices 118, based upon the selected workload placement configuration. This function, however, may be performed by a different software or hardware without departing from a scope of the data center 100.

Although the controller 130 is illustrated in FIG. 1 as comprising an element separate from the electronic components 116a-116n housed in the racks 102a-102n, the controller 130 may comprise one or more of the electronic components 116a-116n without departing from a scope of the data center 100 disclosed herein. In addition, or alternatively, the controller 130 may comprise software configured to operate on a computing device, for instance, one of the electronic components 116a-116n or a separate computing device. In any regard, various operations performed by the controller 130 are described in greater detail with respect to the following figures.

Figure 2:
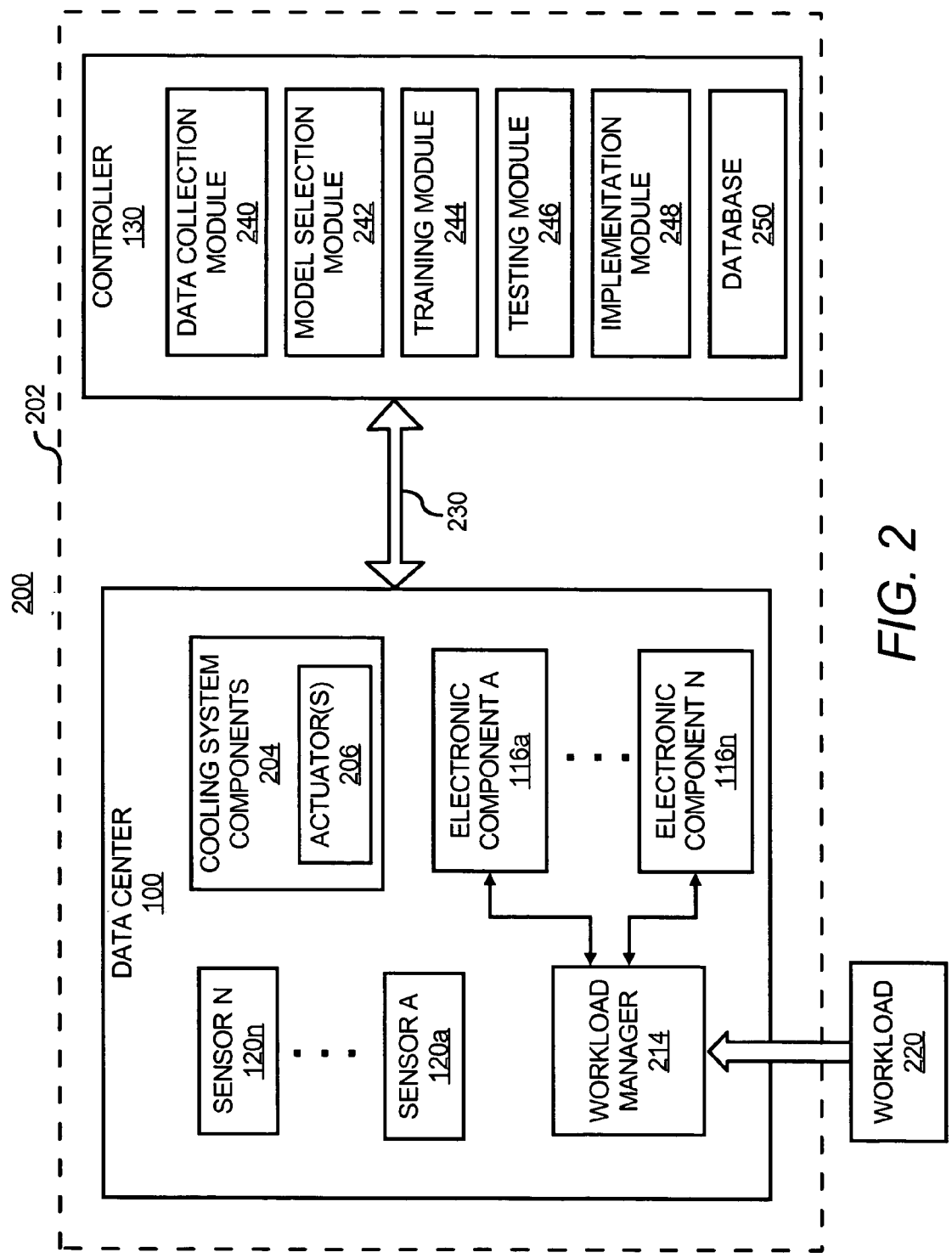
FIG. 2 shows a block diagram of a system for management of a data center, according to an embodiment of the invention.

With reference now to FIG. 2, there is shown a block diagram 200 of a data center management system 202, according to an example. It should be understood that the following description of the block diagram 200 is but one manner of a variety of different manners in which such a management system 202 may be configured. In addition, it should be understood that the management system 202 may include additional components and that some of the components described herein may be removed and/or modified without departing from a scope of the management system 202. For instance, the management system 202 may include any number of sensors, memories, processors, air moving devices, vent tiles, etc., as well as other components, which may be implemented in the operations of the management system 202.

As shown, the management system 202 includes the controller 130 depicted in FIG. 1, which may comprise any of the computing devices described above. The controller 130 may moreover comprise a microprocessor, a micro-controller, an application specific integrated circuit (ASIC), and the like, configured to perform various processing functions. In addition, or alternatively, the controller 130 may comprise software operating in any of a number of computing devices.

The management system 202 is also depicted as including various components of the data center 100. More particularly, the data center 100 is schematically depicted as including the electronic components 116a-116n and a plurality of sensors 120a-120n. The sensors 120a-120n are also depicted as being positioned at various locations throughout the data center 100 in FIG. 1. The sensors 120a-120n may generally comprise sensors configured to detect at least one environmental condition, such as, airflow temperature, mass flow rates of airflow, velocities of airflow, absolute humidity, pressure, etc.

Also depicted in the data center 100 are cooling system components 204, which may include the air moving devices 114a-114n and the air delivery devices 118. The cooling system components 204 are also depicted as including actuators 206, which may comprise various types of actuators. For instance, for the air moving devices 114a-114n, the actuators 206 may comprise devices configured to vary the temperature or the flow rate at which air is supplied by the air moving devices 114a-114n. In addition, for the air delivery devices 118, the actuators 206 may comprise motors designed to vary the direction or the rate at which airflow is supplied through the air delivery devices 118.

In operation, the data center 100 may receive a workload 220, which may be in the form of web requests, data analysis, multimedia rendering, or other types of applications. The workload 220 may be received by a workload manager 214, which may comprise any of the computing devices described above. The workload manager 214 may moreover comprise a microprocessor, a micro-controller, an application specific integrated circuit (ASIC), and the like, configured to perform various processing functions. In addition, or alternatively, the workload manager 214 may comprise software operating in any of a number of computing devices. Moreover, the workload manager 214 may comprise or form part of the controller 130.

In one instance, the workload manager 214 may determine which of the electronic components 116a-116n comprises configurations suitable to perform the workload 220. In another instance, the workload manager 214 may determine which of those electronic components 116a-116n have sufficient capacities to perform the workload 220. In a further instance, the workload manager 214 may determine the number of electronic components 116a-116n required or have been contracted to perform the workload 220. In any case, the workload manager 214 may assign the workload 220 to the selected one or more electronic components 116a-116n. However, prior to assigning the workload 220, the controller 130 may communicate instructions to the workload manager 214 to assign the workload 220 according to one or more control policies as described in greater detail herein below.

The workload manager 214 may also monitor various activities regarding performance of the workload 220. For instance, the workload manager 214 may monitor utilization metrics of the network to which the electronic components 116a-116n are connected. In other words, the workload manager 214 may track the general condition of the network.

The workload manager 214 may transmit or otherwise send the monitored information to the controller 130 over a network 230, which represents a wired or wireless structure in the data center 100 for the transmission of data between the various components of the management system 202. The network 230 may comprise an existing network infrastructure or it may comprise a separate network configuration installed for the purpose of management of various data center 100 operations by the controller 130. The network 230 may also form a communication link between the sensors 120a-120n and the controller 130. Alternatively, however, the sensors 120a-120n may communicate detected condition information to the controller 130 through the workload manager 214.

The workload manager 214 may collect the monitored information from electronic components 116a-116n, and in certain instances, from the sensors 120a-120n and may tag the monitored information with identifying data prior to communicating the monitored information to the controller130. The identifying data may include, for instance, information pertaining to the electronic component 116a-116n, the sensor 120a-120n, network, etc., from which the monitored information was received. In addition, the workload manager 214 may tag the monitored information with the identifying data as metadata communicated to the controller 130.

Although the workload manager 214 has been described as performing various specific functions, it should be understood that the workload manager 214 may perform many other functions with regard to assigning the workload 220 as well as in tracking the electronic components 116a-116n in performing the workload 220, without departing from a scope of the management system 202 disclosed herein.

In any regard, the controller 130 may invoke a data collection module 240 to collect and store the monitored information received from the workload manager 214. The monitored information may include the workload placed on the electronic components 116a-116n, the temperatures detected by the sensors 120a-120n, network utilization levels, etc., and may be stored in a database 250 that the controller 130 may access.

The database 250 may store additional information pertaining to the electronic components 116a-116n, the sensors 120a-120n, and the cooling system components 204. The additional information may include, for instance, the locations of the electronic components 116a-116n and the sensors 120a-120n. The additional information may further include, for instance, the locations and rated capacities of the air moving devices 114a-114n, the locations of the air delivery devices 118, etc. Although the database 250 has been illustrated as forming part of the controller 130, the database 250 may comprise a component separate from the controller 130 without departing from a scope of the management system 202.

In one example, the controller 130 may implement the data collection module 240 to collect data to be included in a training set of data. The training set of data may include the detected temperature conditions under various power and cooling profiles. In other words, the training set of data may include the resulting heat profiles at various cooling system component 204 settings and workload 220 placements. The controller 130 may create the training set of data from conditions actually detected in the data center 100, such as, from the sensors 120a-120n. In addition, or alternatively, the controller 130 may access a computational fluid dynamics modeling program, such as, FLOVENT, available from Flomerics, Inc., of Marlborough, Mass., to perform one or more simulations to obtain data to populate the training set of data. In any regard, the controller 130 may store the training set of data in the database 250. In addition, the controller 130 may employ the training set of data to train a machine learning application configured to develop a model of the heat profile in the data center 100, as described in greater detail herein below.

The controller 130 may invoke a selection module 242 to analyze the collected information and to select a suitable machine learning application for use in developing the model based upon the analyzed information. For instance, based upon an analysis of the collected information, the controller 130 may require that a suitable technique be capable of producing outputs that fall within a continuous range and are the product of non-linear relationships between the inputs. Examples of suitable machine learning techniques that meet these requirements are neural networks, Markov models, and linear programming.

The controller 130 may also invoke a training module 244 to train the model based upon the selected machine learning application. In addition, the controller 130 may invoke a testing module 246 to test the accuracy of the model. The controller 130 may, furthermore, invoke an implementation module 248 to implement the model to predict the heat profile of the data center 100, which the controller 130 may employ in determining a desirable workload placement configuration. More particularly, for instance, the controller 130 may invoke the implementation module 248 to predict the costs resulting from various workload placement configurations from the model. In addition, the controller 130 may use the predicted costs to, for instance, place the workload according to the configuration associated with the least amount of costs.

Some or all of the modules 240-248 may comprise software stored either locally or in an external memory which the controller 130 may invoke. In addition, or alternatively, some or all of the modules 240-248 may comprise one or more hardware devices that may be implemented by the controller 130. As such, for example, the controller 130 may be stored at a single location or the controller 130 may be stored in a distributed manner across multiple locations, where the location(s) comprise at least one of hardware and software.

Various operations performed by the controller 130 are described in greater detail with respect to the following flow diagrams.

Figure 3:
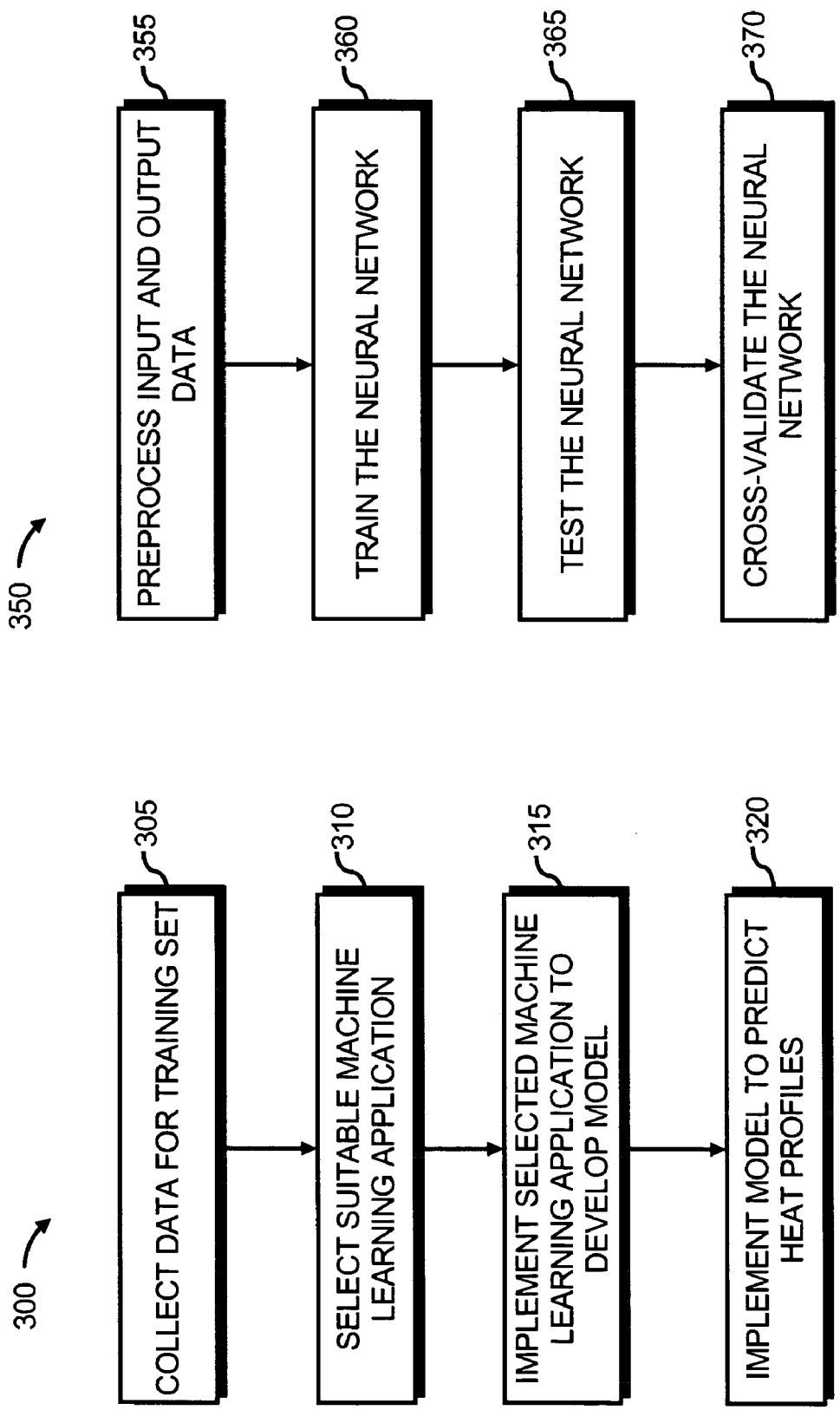
FIG. 3A shows a flow diagram of a method for modeling thermal conditions in a data center, according to an embodiment of the invention.
FIG. 3B shows a flow diagram of a method for modeling thermal conditions in a data center using a neural network, according to an embodiment of the invention.

With reference first to FIG. 3A, there is shown a flow diagram of a method 300 for modeling heat profiles in a data center, according to an example. It is to be understood that the following description of the method 300 is but one manner of a variety of different manners in which an example of the invention may be practiced. It should also be apparent to those of ordinary skill in the art that the method 300 represents a generalized illustration and that other steps may be added or existing steps may be removed, modified or rearranged without departing from a scope of the method 300.

The description of the method 300 is made with reference to the management system 202 illustrated in FIG. 2, and thus makes reference to the elements cited therein. It should, however, be understood that the method 300 is not limited to the elements set forth in the management system 202. Instead, it should be understood that the method 300 may be practiced by a system having a different configuration than that set forth in the management system 202.

Generally speaking, the method 300 may be employed by the controller 130 to manage the data center 100. The term "manage" may be defined, for instance, as the ability of the controller 130 to monitor and assess thermal conditions in the data center 100, including the development of a model for the thermal conditions. In addition, this term may be defined as the ability of the controller 130 to formulate and implement cooling or workload placement schemes based upon the assessed thermal conditions.

In addition, the method 300 pertains to the use of a machine learning application to develop a model that predicts the heat profiles in the data center 100 resulting from various cooling and power profiles. More particularly, the machine learning application may develop the model using historical data pertaining to past correlations between the cooling profiles, the power profiles, and the heat profiles. In one respect, the controller 130 may implement the model to predict the impact various power profiles and cooling profiles have on the heat profile. The predicted heat profiles may be used, for instance, to determine whether hazardous conditions may result in the data center 100, such as, hot spot formations.

The controller 130 may also use the predicted heat profiles to calculate the costs associated with the various power profiles and cooling profiles. In addition, the controller 130 may store the various power profiles in lists ordered according to their respective costs. In this regard, the controller 130 may implement the power profile that results in the least amount of cooling or other costs.

At step 305, the controller 130 may collect data to be included into a set of data for training a machine learning application, which may comprise software, an algorithm, a separate device, etc. In any regard, the data may comprise inputs and outputs to the machine learning application. As such, for instance, the data may comprise various power profiles, cooling profiles, and heat profiles of the data center 100. The power profiles may comprise the distribution of workload among the electronic components 116a-116n. In addition, the power profiles may be communicated to the controller 130 by the workload manager 214 in any of the manners discussed herein above. In collecting the data at step 305, the controller 130 may at least one of systematically exercise the heat loads generated by the electronic components 116a-116n and leverage real-time usage information and trends of the electronic components 116a-116n.

The cooling profiles may comprise the settings of the cooling system components 204, such as, the temperatures and airflow rates at which cooling airflows are supplied by the air moving devices 114a-114n. The cooling profiles may be communicated to the controller 130 by the cooling system components 204. In addition, or alternatively, the controller 130 may have the cooling system component 204 setting information in situations where the controller 130 controls the cooling system components 204.

The heat profiles may comprise the temperatures at various locations in the data center 100. In addition, the heat profiles may correspond to various power profile and cooling profile settings. That is, a first heat profile may correspond to a first power and cooling profile, a second heat profile may correspond to a second power and cooling profile, and so forth. In addition, the controller 130 may collect the heat profiles from one or more sensors 120a-120n. The one or more sensors 120a-120n may comprise statically located sensors positioned to detect temperatures around their respective locations. In addition or alternatively, the one or more sensors 120a-120n may comprise movable sensors that may be moved, either manually or with a robotic device, to various locations in the data center 100 to obtain the temperature measurements.

According to another example, the controller 130 may implement a computational fluid dynamics (CFD) modeling program, such as, FLOVENT, to perform one or more simulations to obtain the heat profiles at the various power and cooling profiles. In addition, the controller 130 may store the heat profiles corresponding to the various power profiles and cooling profiles.

At step 310, a suitable machine learning application may be selected. More particularly, for instance, the policy agent 130 may invoke the selection module 242 to select a suitable machine learning application to develop the model. A "suitable" machine learning application is one that is capable of producing an output that falls within a continuous range of values, capable of representing complex relationships, given that the equations governing heat flow and transfer are non-linear, capable of constructing the model using a relatively large amount of input data, and capable of making substantially real-time predictions using the most recent instrumentation data. Examples of suitable machine learning applications are neural networks, Markov models, and linear programming, to name but a few.

At step 315, the controller 130 may implement the selected machine learning application to develop a model of the heat profile in the data center 100. A more detailed description of an example in which the model is developed using a neural network is presented herein below with respect to the method 350 depicted in FIG. 3B.

At step 320, the controller 130 may invoke the implementation module 248 to implement the model to predict heat profiles in the data center 100 for various power and cooling profiles. As described in greater detail herein below with respect to the method 400 depicted in FIG. 4, the controller 130 may further use the predicted heat profiles in controlling, for instance, the placement of workload among various electronic components 116a-116n to achieve pre-specified thermal or cost objectives.

Turning now to FIG. 3B, there is shown a flow diagram of a method 350 which shows in greater detail, an example in which the model is developed using a neural network, according to an example. More particularly, in the method 350, the controller 130 is configured to invoke the training module 244 to implement a neural network in developing a model having a number of inputs and outputs. The inputs may include, for instance, the various power profiles and cooling profiles. The outputs of the model are the temperatures at various locations in the data center 100.

The controller 130 may graphically position the inputs in an input layer and the outputs in an output layer of the neural network. Between the input layer and the output layer, there are L internal or hidden layers. Each layer contains a set of elements known as neurons, where each neuron i accepts $N_i$ inputs from the previous layer, applies a weighting factor $\omega_{i,a}$ to each input $\chi_a$, and uses the sum of the weighted inputs as the x-value for its activation function g. The result of this function, $y_i$ is passed to neurons in the next layer.

$$y_i = g\left(\sum_{a=0}^{N_i} \omega_{i,a} \cdot \chi_a\right). \quad \text{Equation (1)}$$

The controller 130 may employ the sigmoid activation function because it only allows positive output values from neurons and outputs contiguous values. An example of the sigmoid activation function is:

$$g(x) = \frac{1}{1+e^{-(x \cdot s)}}. \quad \text{Equation (2)}$$

In Equation (2), the sigmoid parameter s controls the steepness of the output slope. The controller 130 may select an appropriate sigmoid parameter s. An appropriate sigmoid parameter s may be selected such that it is not overlay steep nor overly flat. In other words, the appropriate sigmoid parameter s is one that is capable of substantially accurately predicting the heat profiles for previously seen power profiles, but is not sufficiently general to provide accurate answers for new power profiles.

As shown in the method 350, the controller 130 may pre-process the input and output data sets at step 355. The output values will be in the range [0,1], due to the sigmoid function. As such, the controller 130 may scale all of the input and output values to fall within the range [0,1] to thereby provide consistency between input and output data and to allow the model to predict a relatively wide range of heat profiles.

At step 360, the controller 130 may train the neural network. More particularly, for instance, the controller 130 may select a set of values for the model and implementation parameters, and may construct the neural network by calculating the weights for each input to each neuron. In other words, at step 360, the controller 130 may provide a set of inputs and outputs, such as, from the training set of data, and may adjust the weights to minimize the mean square error (MSE) between the predicted outputs and the actual outputs over the entire set of training data. In essence, therefore, the controller 130 may train the neural network through solving an optimization problem that minimizes the MSE. The controller 130 may leverage various techniques to solve the optimization problem, such as, genetic algorithms, simulated annealing, back-propagation, etc.

The controller 130 may continue performing step 360 in an iterative manner until the MSE reaches a user-defined minimum threshold or the controller 130 determines that step 360 has been performed a pre-specified number of times.

Once the controller 130 has completed training the neural network at step 360, the controller 130 may invoke the testing module 246 to test the neural network, as indicated at step 365. More particularly, for instance, the controller 130 may use the neural network to predict the outputs for a given set of inputs that were not present in the training data. As such, the testing step 365 enables the controller 130 to examine to what extent the neural network is generally applicable, and that the training step 360 did not create a neural network that is overly-trained to inputs it has already encountered.

At step 370, the controller 130 may invoke the testing module 246 to cross-validate the neural network. For example, the controller 130 may employ a five-fold cross-validation (FFCV), which is a standard statistical analysis technique, to generally assess the suitability of the manner in which the neural network was developed. In implementing the FFCV technique, the controller 130 may divide the input, output tuples into fifths. The policy agent 130 uses one fifth as a test set and the learner is trained on the other four fifths. This controller 130 repeats this process five times with a different fifth used for testing each time.

By way of example, if there is data on ten heat profiles, the heat profiles are broken into five groups of two heat profiles each. The first neural net is trained using data from the first eight heat profiles, and tested on the ninth and tenth heat profiles. The second neural network is trained using data from heat profiles 1-6, 9, and 10; and this neural network is tested using data from heat profiles 7 and 8.

The controller 130 may quantify the suitability of a given set of model and implementation parameters by calculating the sum of squared error (SSE) across the five neural networks generated during FFCV. A relatively smaller SSE generally indicates that the model and implementation parameters generate suitably accurate models.

According to another example, the controller 130 may validate the accuracy of the developed model by comparing the heat profile predicted form the model with a heat profile calculated through use of a CFD modeling program.

Figure 4:
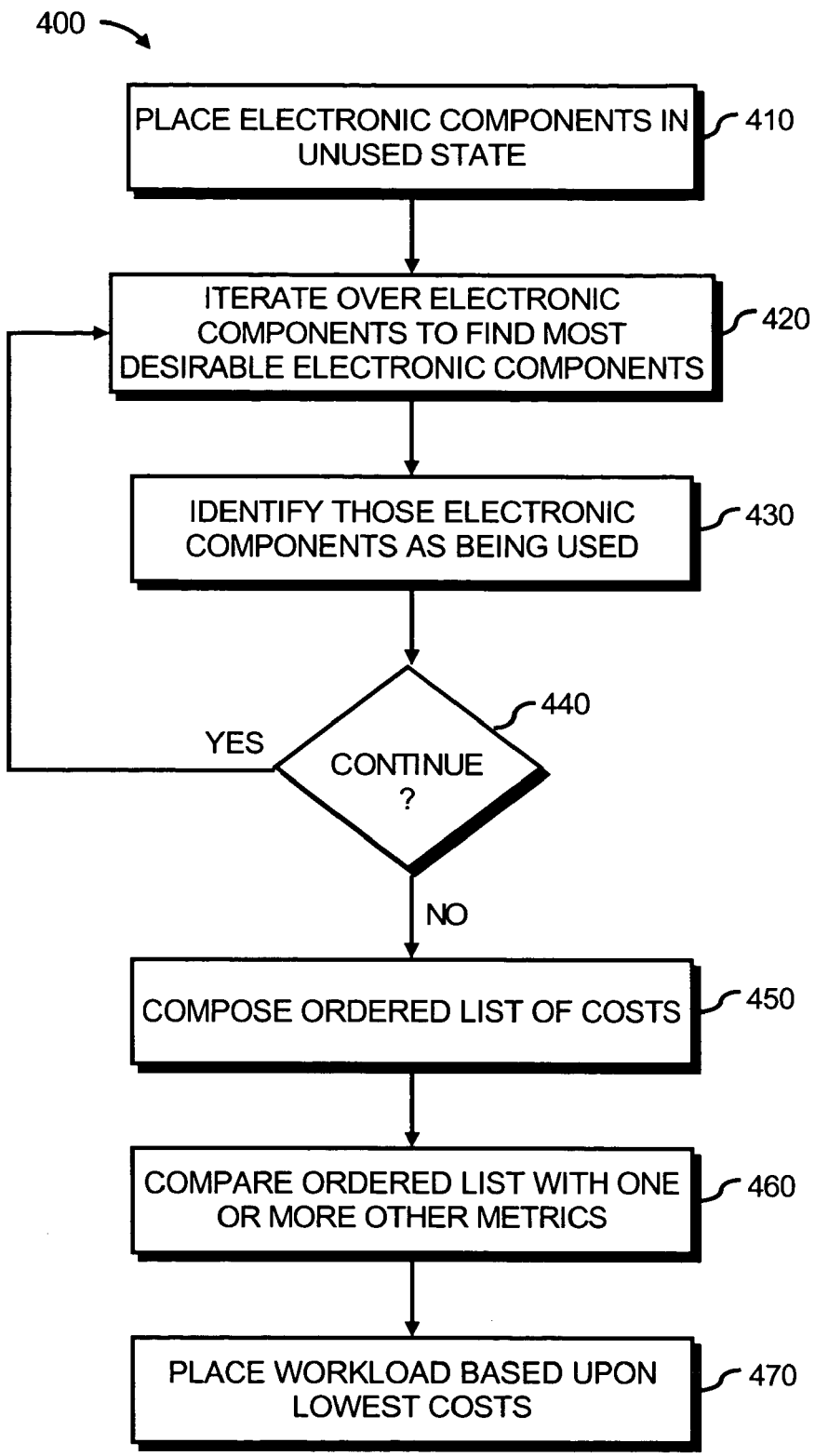
FIG. 4 shows a flow diagram of a method for placing workload among a plurality of electronic components utilizing the model developed in the method depicted in FIG. 3A, according to an embodiment of the invention.

With reference now to FIG. 4, there is shown a flow diagram of a method 400 for placing workload among the electronic components 116a-116n utilizing the model developed in the method 300 depicted in FIG. 3A, according to an example. It is to be understood that the following description of the method 400 is but one manner of a variety of different manners in which an example of the invention may be practiced. It should also be apparent to those of ordinary skill in the art that the method 400 represents a generalized illustration and that other steps may be added or existing steps may be removed, modified or rearranged without departing from a scope of the method 400.

For any workload that uses N of the M servers in the data center 100, there are $$\binom{M}{N}$$

possible unique power profiles. As such, for a data center having an appreciable number of servers, there are a substantially large number of possible unique power profile combinations.

Generally speaking, the controller 130 may invoke the implementation module 248 to implement the model in discovering an unknown power profile that has a desirable heat profile from the possible unique power profile combinations. More particularly, for instance, the controller 130 may implement a heuristic to search through the possible unique power profiles to locate the power profile associated with the desirable heat profile, as discussed in greater detail herein below. By way of example, the controller 130 may be programmed to perform a coordinate-space search of the possible unique power profiles. In one respect, the runtime for the method 400 is O(N·M), which is significantly smaller than $$\binom{M}{N}.$$

Using the model, the controller 130 may initially place all of the electronic components 116a-116n into an unused state, which may comprise placing the electronic components 116a-116n in "off" or "idle" state, at step 410. At step 420, the controller 130 may iterate over the electronic components 116a-116n to find the most desirable electronic components 116a-116n or blocks of electronic components 116a-116n that create a heat profile that yields the lowest return air temperatures for the air moving devices 114a-114n. In other words, through use of the model, the controller 130 may determine the heat profiles predicted to result from placing a given workload on one or more of a first set of electronic components 116a-116n. In addition, the controller 130 may determine the heat profiles predicted to result from placing the workload on one or more of a second set of electronic components 116a-116n. The controller 130 may continue to predict the heat profiles for a number of sets of components 116a-116n in an iterative manner.

The controller 130 may furthermore determine which of the one or more electronic components 116a-116n are predicted to result in a heat profile that yields the lowest return air temperatures for the air moving devices 114a-114n in performing the given workload. As such, those one or more electronic components 116a-116n may result in the lowest cooling costs. In addition, therefore, those one or more electronic components 116a-116n may be considered as comprising the most desirable electronic components 116a-116n.

At step 430, the controller 130 may identify the electronic components 116a-116n that have been tested as having been used. In this regard, those electronic components 116a-116n may be tested once at step 420.

At step 440, the controller 130 may determine whether to continue the method 400. The controller 130 may continue the method 400 until a sufficient number of electronic components 116a-116n has been activated. If the controller 130 determines that a sufficient number of electronic components 116a-116n have not been activated, the controller 130 may continue the method 400 by continuing on to the next iteration, as indicated at step 420. In addition, the controller 130 may continue to perform steps 420-440 until a sufficient number of electronic components 116a-116n has been activated Following the "no" condition at step 440, the controller 130 may compose an ordered list of costs associated with running each of the electronic components 116a-116n, as indicated at step 450. The ordered list may also include a listing of which electronic components 116a-116n are the best, that is, those electronic components 116a-116n whose operations result in the least amount of cooling costs, and which are the worst, that is, those whose operations result in the greatest amount of cooling costs.

At step 460, the controller 130 may compare the ordered list of costs with other metrics, such as, network performance considerations. In other words, the controller 130 may make workload placement decisions based upon factors that cross-cut into considerations other than cooling costs. Thus, for instance, if the controller 130 predicts that it would be least expensive to run workload A on an electronic component A and to run workload B on electronic component B, the controller 130 may compare these costs with the effect this workload placement has on network conditions. More particularly, the controller 130 may assign a cost value to the negative affects this workload placement may have on the network conditions and may determine whether the savings in cooling costs are sufficient to outweigh the costs associated with the negative effects on network conditions.

In one respect, if the controller 130 determines that the costs associated with the negative effects on network conditions outweighs the savings in cooling costs, the controller 130 may select another workload placement configuration (power profile) from the ordered list of costs. In addition, the controller 130 may repeat steps 450 and 460 until a desirable workload placement configuration is determined.

At step 470, the controller 130 may cause the workload to placed among the electronic components 116a-116n in the power profile configuration determined at step 460. In addition, or alternatively, the controller 130 may integrate the ordered list of costs into existing batch schedulers using common mechanisms such as server priorities.

The operations set forth in the methods 300, 350, and 400 may be contained as a utility, program, or subprogram, in any desired computer accessible medium. In addition, the method 300, 350, and 400 may be embodied by a computer program, which may exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 5:
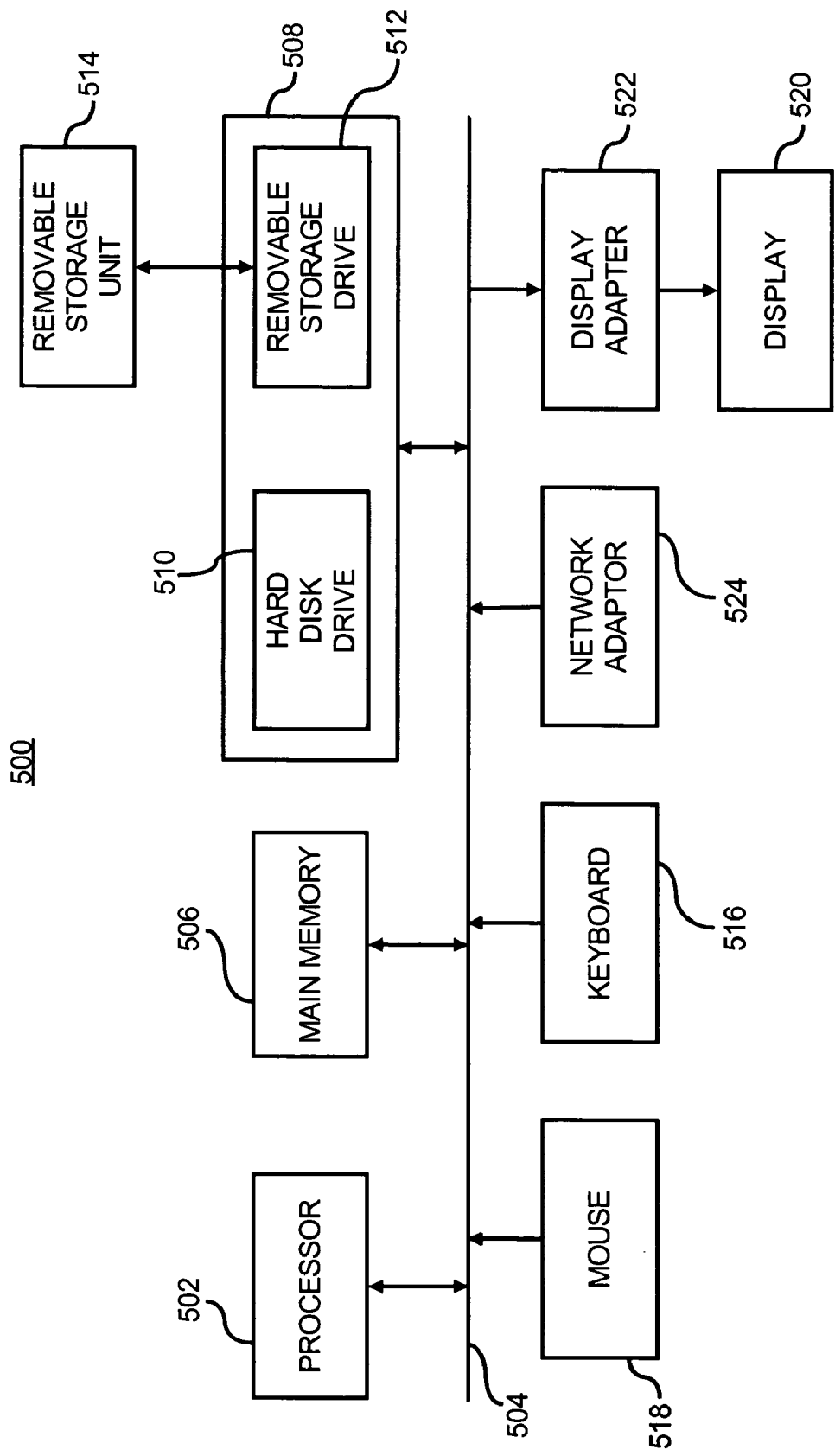
FIG. 5 illustrates a computer system, which may be employed to perform various functions described herein, according to an embodiment of the invention.

FIG. 5 illustrates a computer system 500, which may be employed to perform the various functions of the controller 130 described herein above, according to an example. In this respect, the computer system 500 may be used as a platform for executing one or more of the functions described hereinabove with respect to the controller 130.

The computer system 500 includes a processor 502. The processor 502 may be used to execute some or all of the steps described in the methods 300, 350, and 400. Commands and data from the processor 502 are communicated over a communication bus 504. The computer system 500 also includes a main memory 506, such as a random access memory (RAM), where the program code for, for instance, the controller 130, may be executed during runtime, and a secondary memory 508. The secondary memory 508 includes, for example, one or more hard disk drives 510 and/or a removable storage drive 512, representing a floppy diskette drive, a magnetic tape drive, a compact disk drive, etc., where a copy of the program code for the management of power may be stored.

The removable storage drive 510 reads from and/or writes to a removable storage unit 514 in a well-known manner. User input and output devices may include a keyboard 516, a mouse 518, and a display 520. A display adaptor 522 may interface with the communication bus 504 and the display 520 and may receive display data from the processor 502 and convert the display data into display commands for the display 520. In addition, the processor 502 may communicate over a network, for instance, the Internet, LAN, etc., through a network adaptor 524.

It will be apparent to one of ordinary skill in the art that other known electronic components may be added or substituted in the computer system 500. In addition, the computer system 500 may include a system board or blade used in a rack in a data center, a conventional "white box" server or computing device, etc. Also, one or more of the components in FIG. 5 may be optional (for instance, user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for managing a data center having a plurality of electronic components configured to generate varying levels of heat loads under different power level utilizations, said method comprising:

collecting data for inclusion in a training set of data, said data comprising heat loads generated by the plurality of electronic components at multiple locations in the data center resulting from various power profiles, wherein each of the various power profiles comprises a different power level utilization arrangement among the plurality of electronic components;

implementing a machine learning application to develop a model designed to predict a plurality of thermal topologies of the data center under varying power profiles using the training set of data, wherein each of the plurality of thermal profiles is a function of a physical topology, a cooling profile, and a power profile of the data center; and implementing the model to iteratively predict a plurality of heat profiles of the data center corresponding to a plurality of power profiles that are outside of the training set of data, wherein each of the plurality of heat profiles of the data center identifies a thermal topology resulting from application of a particular thermal profile.

2. The method according to claim 1, wherein collecting data comprises at least one of systematically exercising the heat loads generated by the plurality of electronic components and leveraging real-time usage information and trends of the plurality of electronic components.

3. The method according to claim 1, wherein collecting data further comprises collecting the temperatures from one or more temperature sensors.

4. The method according to claim 1, wherein collecting data further comprises calculating the temperatures through use of a computational fluid dynamics modeling application.

5. The method according to claim 1, wherein the machine learning application comprises a neural network, said method further comprising: preprocessing input and output data;

training the neural network;

testing an accuracy of the model; and cross-validating the neural network.

6. The method according to claim 5, wherein preprocessing the input and output data further comprises scaling the input and output values to fall within a predefined range.

7. The method according to claim 5, wherein testing the neural network further comprises implementing the trained neural network to predict outputs for a given set of inputs that were not present in the training set of data.

8. The method according to claim 1, wherein iteratively predicting heat profiles further comprises:

determining heat profiles predicted to result from placement of the workload on one or more of first set of electronic components;

determining heat profiles predicted to result from placement of the workload on one or more of a second set of electronic components;

determining which of the one or more first set of electronic components and the one or more of the second set of electronic components results in a more beneficial heat profile with respect to each other; and identifying the determined set of electronic components as resulting in the more beneficial heat profile.

9. The method according to claim 1, further comprising:

correlating costs associated with the predicted heat profiles; composing a list of the costs according to the amounts of the costs; and placing the workload on the one or more electronic components predicted to result in a heat profile associated with the least amounts of costs.

10. The method according to claim 9, further comprising:

comparing the costs in the composed list with costs associated with at least one other metric; and wherein placing the workload further comprises placing the workload on one or more of the electronic components based on which of the costs in the composed list and the costs associated with at least one other metric is lowest.

11. A system for managing a data center having a plurality of electronic components configured to generate varying levels of heat loads under different power level utilizations, said system comprising:

a data collection module for collecting data for populating a training set of data, said data comprising heat loads generated by the plurality of electronic components at multiple locations in the data center resulting from various power profiles, wherein each of the various power profiles comprises a different power level utilization arrangement among the plurality of electronic components;

a training module for training a machine learning application to develop a model designed to predict a plurality of thermal topologies of the data center using the training set of data, wherein each of the plurality of thermal profiles is a function of a physical topology, a cooling profile, and a power profile of the data center;

an implementation module for implementing the model to iteratively predict a plurality of heat profiles of the data center corresponding to a plurality of power profiles that are outside of the training set of data, wherein each of the plurality of heat profiles of the data center identifies a thermal topology resulting from application of a particular thermal profile; and a controller configured to invoke the data collection module, the training module, and the implementation module to manage the data center.

12. The system according to claim 11, further comprising:

at least one temperature sensor configured to detect temperatures in the data center; and wherein the data collection module is configured to collect the temperatures detected by the at least one temperature sensor.

13. The system according to claim 11, further comprising:

a computational fluid dynamics modeling application configured to calculate heat loads at multiple locations in the data center; and wherein the data collection module is configured to collect the temperatures calculated by the computational fluid dynamics modeling application.

14. The system according to claim 11, wherein the training module is further configured to develop the model through use of a neural network, said system further comprising:

a testing module configured to test an accuracy of the model, said testing module being further configured to cross-validate the neural network.

15. The system according to claim 11, wherein the controller is further configured to correlate costs associated with the predicted heat profiles, compose a list of the costs according to the amounts of the costs, and place the workload on the one or more electronic components predicted to result in a heat profile associated with the least amount of costs.

16. The system according to claim 15, wherein the controller is further configured to compare the costs in the composed list with costs associated with at least one other metric, and to place the workload on one or more of the electronic components based upon which of the costs in the composed list and the costs associated with at least one other metric is lowest.

17. A computer readable storage medium on which is embedded one or more computer programs, said one or more computer programs implementing a method for managing a data center having a plurality of electronic components configured to generate varying levels of heat loads under different power level utilizations, said one or more computer programs comprising a set of instructions for:

implementing a machine learning application to develop a model designed to predict a plurality of thermal topologies of the data center under varying power profiles using a training set of data, said training set of data comprising heat loads generated by the plurality of electronic components resulting from various power profiles, wherein each of the various power profiles comprises a different power level utilization arrangement among the plurality of electronic components;

implementing the model to iteratively predict a plurality of heat profiles of the data center corresponding to a plurality of power profiles that are outside of the training set of data for a workload to be performed by one or more of the plurality of electronic components, wherein each of the plurality of heat profiles of the data center identifies a thermal topology resulting from application of a particular thermal profile; and placing the workload on the one or more of the plurality of electronic components in a power profile arrangement that corresponds to a most cost efficient heat profile.

* * * * *